United States Patent
Zhang et al.

(10) Patent No.: US 9,368,409 B2
(45) Date of Patent: Jun. 14, 2016

(54) SEMICONDUCTOR STRUCTURE AND FABRICATION METHOD

(71) Applicant: Semiconductor Manufacturing International (Shanghai) Corporation, Shanghai (CN)

(72) Inventors: Haiyang Zhang, Shanghai (CN); Xuan Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/848,908

(22) Filed: Sep. 9, 2015

(65) Prior Publication Data

US 2016/0086857 A1    Mar. 24, 2016

(30) Foreign Application Priority Data

Sep. 24, 2014    (CN) .......................... 2014 1 0491246

(51) Int. Cl.

| | |
|---|---|
| H01L 21/8234 | (2006.01) |
| H01L 21/308 | (2006.01) |
| H01L 21/66 | (2006.01) |
| H01L 21/3213 | (2006.01) |
| H01L 21/3065 | (2006.01) |
| H01L 21/027 | (2006.01) |
| B81B 7/00 | (2006.01) |
| B81C 1/00 | (2006.01) |

(52) U.S. Cl.
CPC ...... *H01L 21/823437* (2013.01); *B81B 7/0058* (2013.01); *B81C 1/00333* (2013.01); *H01L 21/0276* (2013.01); *H01L 21/3065* (2013.01); *H01L 21/3081* (2013.01); *H01L 21/32139* (2013.01); *H01L 21/823431* (2013.01); *H01L 21/823481* (2013.01); *H01L 22/26* (2013.01)

(58) Field of Classification Search
None
See application file for complete search history.

(56) References Cited

U.S. PATENT DOCUMENTS

| | | | | |
|---|---|---|---|---|
| 2007/0298615 | A1* | 12/2007 | Matsuzawa | ............... G03F 7/40 438/694 |
| 2008/0160256 | A1* | 7/2008 | Bristol | .................. B24B 37/042 428/143 |
| 2010/0167484 | A1* | 7/2010 | Gu | ..................... H01L 21/32139 438/294 |
| 2011/0300698 | A1* | 12/2011 | Han | .................. H01L 21/02057 438/585 |

* cited by examiner

*Primary Examiner* — Asok K Sarkar
(74) *Attorney, Agent, or Firm* — Anova Law Group, PLLC

(57) ABSTRACT

The present disclosure provides a method for fabricating semiconductor devices. The method includes providing a substrate with a gate electrode film on the substrate and a gate electrode pattern film on the gate electrode film; forming at least one pattern layer on the gate electrode pattern film; and using the at least one pattern layer as the etch mask to etch portions of the gate electrode pattern film to expose portions of the gate electrode film and form a gate electrode pattern layer on the gate electrode film, the gate electrode pattern layer including a hard mask layer and a silicon layer, and sidewalls of the silicon layer in a direction perpendicular to a first direction having a first poly line width roughness. The method also includes performing an etch-repairing treatment on the sidewalls of the silicon layer in the direction perpendicular to the first direction.

20 Claims, 11 Drawing Sheets

SEMICONDUCTOR STRUCTURE AND FABRICATION METHOD

CROSS-REFERENCES TO RELATED APPLICATIONS

This application claims the priority of Chinese Patent Application No. 201410491246.3 filed on Sep. 24, 2014, the entire content of which is incorporated herein by reference.

FIELD OF THE DISCLOSURE

The present disclosure relates to the field of semiconductor technology, more particularly, relates to a semiconductor structure and fabrication method.

BACKGROUND

With the rapid advances in semiconductor fabrication technology, semiconductor devices are moving towards higher device density and higher level of integration to achieve higher computing speed, greater data storage, and other preferred features. Accordingly, semiconductor fabrication is becoming increasingly demanding on the etching technology used in the fabrication. The etching of gate structures is critical to the fabrication of a semiconductor device. The etching quality of the gate structures not only determines the dimensions of the gate structure, but also determines the electrical parameters such as the saturation drain current of the semiconductor device.

In an existing fabrication process, forming a semiconductor device includes several steps. As shown in FIG. 1, in step S11, a substrate is provided. The substrate includes gate electrode regions and doped regions between adjacent gate electrode regions. The gate electrode regions include active areas and isolation regions between active areas. In step S12, a gate dielectric film is formed on the substrate and a gate electrode film is formed on the gate dielectric film. The gate dielectric film covers the surfaces of the active areas and doped regions in the substrate. In step S13, a hard mask material layer is formed on the gate electrode film and a patterned photoresist layer is formed on the hard mask material layer. The orthogonal projection of the patterned photoresist layer on the substrate covers the active areas and portions of the isolation regions. In step S14, the patterned photoresist layer is used as the etch mask to etch the hard mask material layer and form a hard mask layer. The patterned photoresist layer is removed. In step S15, the hard mask layer is used as the etch mask to etch the gate electrode film and form gate electrodes on the gate dielectric film.

However, the electrical properties and performance of the semiconductor structures fabricated by the existing fabrication process still need to be improved.

BRIEF SUMMARY OF THE DISCLOSURE

One aspect of the present disclosure provides a method for fabricating semiconductor devices. The method includes providing a substrate with a gate electrode film on the substrate and a gate electrode pattern film on the gate electrode film, the gate electrode pattern film including a hard mask material layer and a silicon material layer on the hard mask material layer; forming at least one pattern layer on the gate electrode pattern film; and using the at least one pattern layer as the etch mask to etch portions of the gate electrode pattern film to expose portions of the gate electrode film and form a gate electrode pattern layer on the gate electrode film, the gate electrode pattern layer including a hard mask layer and a silicon layer on the hard mask layer, and sidewalls of the silicon layer in a direction perpendicular to a first direction having a first poly line width roughness (Poly LWR). The method also includes performing an etch-repairing treatment on the sidewalls of the silicon layer in the direction perpendicular to the first direction such that the sidewalls of the silicon layer in the direction perpendicular to the first direction have a second Poly LWR, the second Poly LWR being lower than the first Poly LWR.

Other aspects or embodiments of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

The electrical properties and performance of the semiconductor structure fabricated by the existing method need to be improved.

Figure 1:
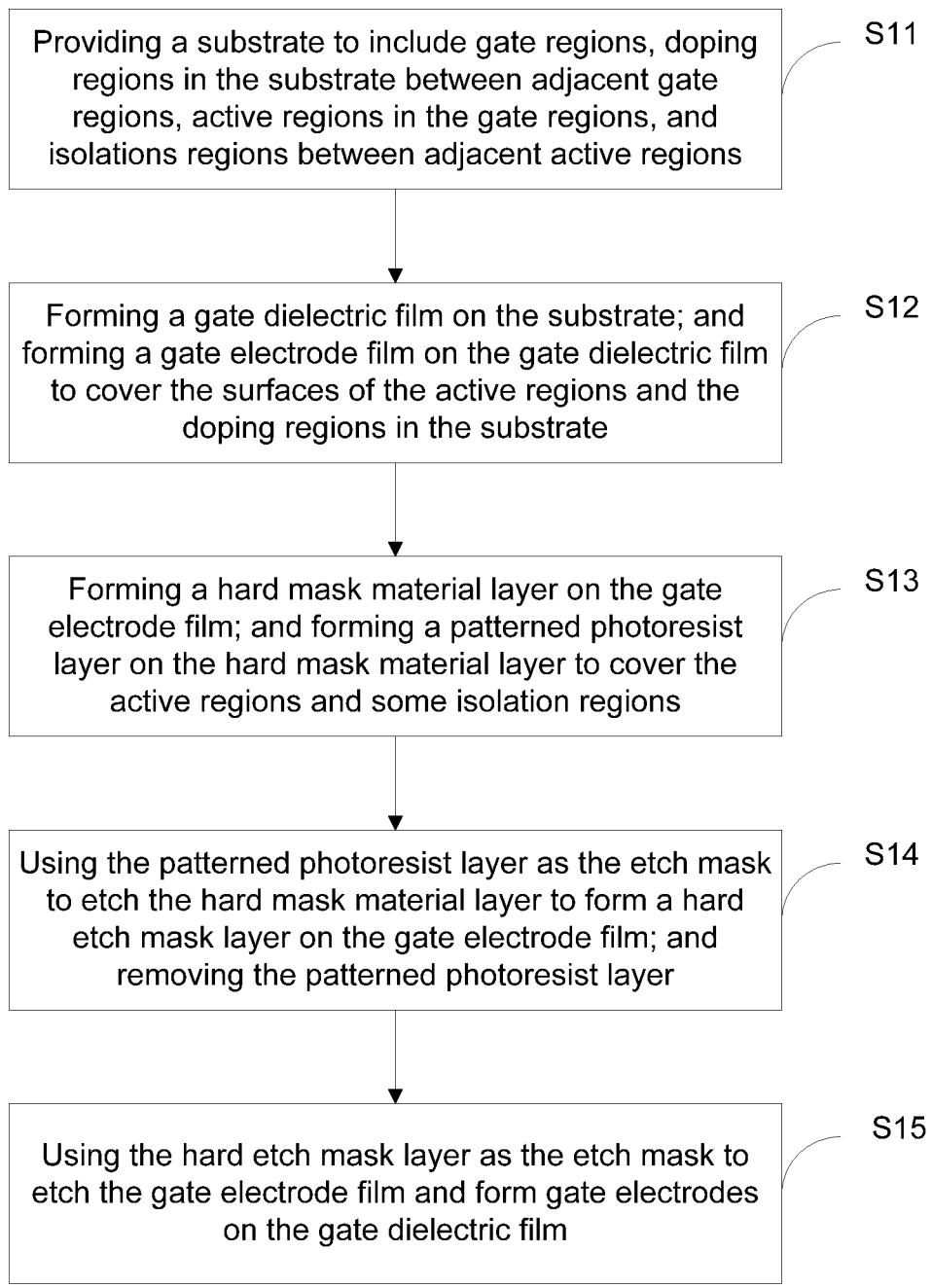
FIG. 1 illustrates a process flow of an existing method for forming semiconductor devices.
Figure 2:
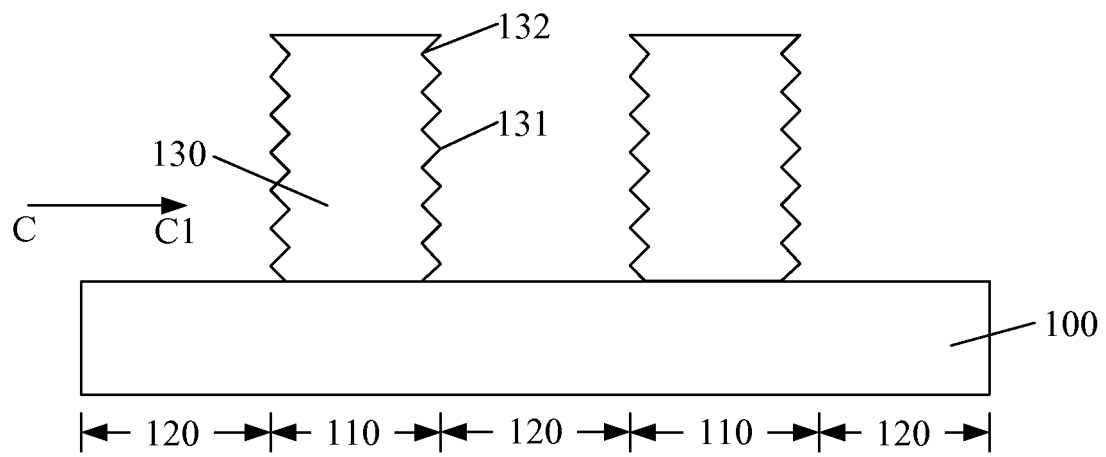
FIG. 2 illustrates a cross-section view of a semiconductor device formed by the existing method for forming semiconductor devices.

As shown in FIG. 2, the cross-section view of semiconductor structures formed by using the existing fabrication method is illustrated. The semiconductor structure includes a substrate 100. The substrate 100 includes gate electrode regions 110 and doped regions 120 adjacent to gate electrode regions 110.

A gate electrode region 110 includes an active area and an isolation region adjacent to the active area. The width of a gate electrode region 110 (the width from a source region to the corresponding drain region) is consistent with the width of the corresponding active area and the width of the corresponding isolation region. A gate electrode 130 is formed to cover the corresponding active area and a portion of the corresponding isolation region.

Ideally, the width of the patterned photoresist layer to form the gate electrode is consistent with the width of the active area such that the subsequently-formed channel region may have a desired channel length according to the fabrication requirements. To form the semiconductor structure, surfaces of the doped regions in the substrate are exposed. The orthogonal projection of the patterned photoresist layer on the substrate 100 covers the surfaces of the active areas and portions of the isolation regions connected to the active areas. Portions of the isolation regions are exposed. The heads of the gate structures may be formed in the isolation regions to prevent leakage current in the semiconductor structure.

A gate electrode with sufficiently small dimensions may be formed by using the method described above. However, the sidewall of a gate electrode formed using the method described above be undesirably rough. For example, the sidewall of the gate electrode 130 may have surface roughness in a direction perpendicular to the channel length direction CC1 (the direction pointing from one doped region 120 to an adjacent doped region 120). The surface roughness may include protruding areas 131 and recessed areas 132 on the surface of the sidewall.

The gate electrode 130 may thus have a large Poly LWR (Poly Line Width Roughness). The Poly LWR may cause the channel length corresponding to a same gate electrode 130 to vary. The quality of the gate electrode 130 to be formed may be low. The electrical properties and performance of the semiconductor structure may be adversely affected. As the dimensions of the semiconductor structures continue to decrease, the Poly LWR on the sidewalls of the gate electrodes of the semiconductor structure may increase as a result of the decreasing dimensions of the semiconductor structures. The electrical properties of the semiconductor structure may become inferior and the semiconductor structure may fail in operation.

It has been found that, when the patterned photoresist layer is being formed, a highly precise photolithography is required. Due to the limitations in the photolithography process, it is difficult to form a patterned photoresist layer with sidewalls to be perfectly perpendicular to the surface of the hard mask material layer. When the patterned photoresist layer is used as the etch mask to etch the hard mask material layer, the hard mask material layer may have rough sidewalls accordingly. Also, when the hard mask layer is being etched, it is often difficult to precisely control the etching process, and the etching process may also cause the hard mask layer may to have rough sidewalls. Meanwhile, the etching process may cause some etching damages to the patterned photoresist layer, and the damaged patterned photoresist layer may not be able to provide desired protection for subsequent fabrication processes.

Thus, sidewalls of the hard mask layer may also have certain Poly LWR. When the hard mask layer is used as the etch mask to etch the gate electrode film and form gate electrodes, the sidewall of a gate electrode in a direction perpendicular to the corresponding channel length direction CC1 may also have considerably large Poly LWR. The Poly LWR of the gate electrode sidewall may be higher than the Poly LWR of the sidewalls of the second gate electrode pattern.

Embodiments of the present disclosure provides a method for forming semiconductor devices to improve the semiconductor structures and properties.

An etch-repairing treatment is performed on the sidewalls of the silicon layer in a direction perpendicular to the first direction such that the sidewalls of the silicon layer has a second Poly LWR. The second Poly LWR is lower than the first Poly LWR. The gate electrode pattern layer may be used as the etch mask to etch the gate electrode film to expose surface of the substrate and form gate electrodes on the substrate. A source region and a drain region are each formed in the substrate at one side of the sidewall of a gate electrode. The sidewall is formed in a direction perpendicular to the first direction.

By performing the etch-repairing treatment on the sidewalls of the initial silicon layer, the sidewalls of the initial silicon layer may have reduced Poly LWR or a desirably smooth surface. The silicon layer to be formed may thus also have reduced Poly LWR or a desirably smooth surface. When the gate electrode patterned layer is used as the etch mask to etch the gate electrode film and form the gate electrodes, sidewall of each gate electrode may also have reduced Poly LWR. Thus, the subsequently-formed gate electrodes may have improved quality. Electrical properties, performance, and reliability of the semiconductor structures may be improved accordingly.

Embodiments are now explained in detail with drawings to better illustrate the purpose, characteristics, and advantages of the present disclosure.

In one embodiment, the fabrication process to form the gate electrodes of the semiconductor structure is illustrated using a double patterning method. The pattern layer may include a first pattern layer with patterns arranged parallel to a first direction and a second pattern layer with patterns arranged parallel to a second direction. The second direction may be perpendicular to the first direction.

Figure 18:
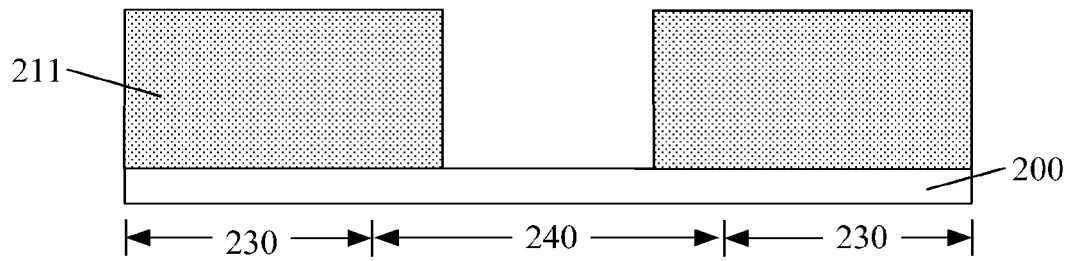
FIG. 18 illustrates a cross-section view of the semiconductor device illustrated in FIG. 17.
Figure 19:
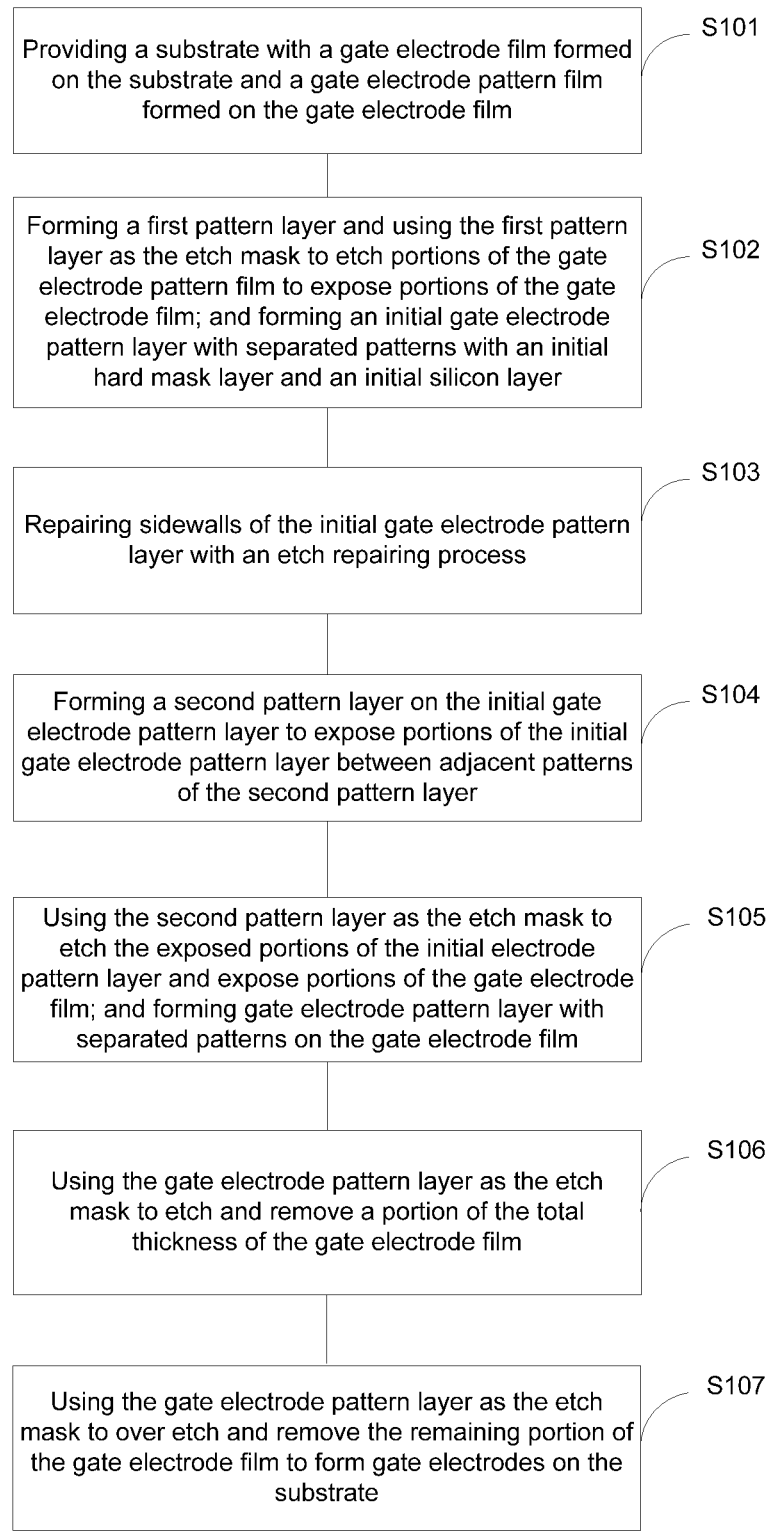
FIG. 19 illustrates an exemplary fabrication process of semiconductor devices consistent with the disclosed embodiments.

FIG. 19 illustrates an exemplary fabrication process of a semiconductor structure consistent with the disclosed embodiments and FIGS. 3 to 18 illustrate exemplary semiconductor structures corresponding to various stages of an exemplary fabrication process of the semiconductor structure.

Figure 3:
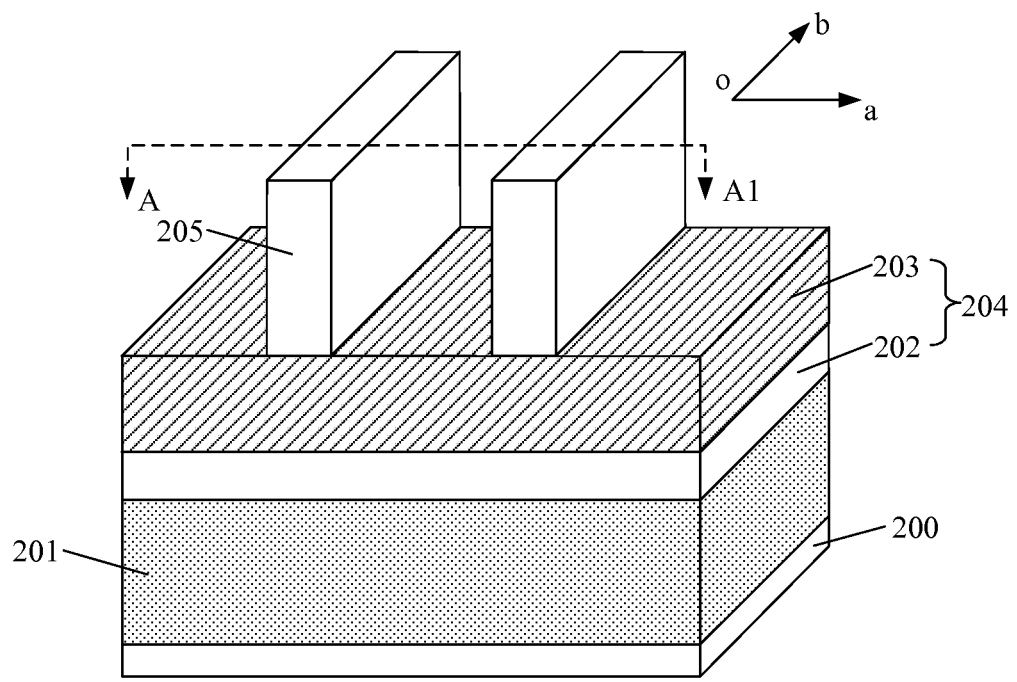
FIG. 3 illustrate an exemplary semiconductor device corresponding to a certain stage of an exemplary fabrication process consistent with the disclosed embodiments.
Figure 4:
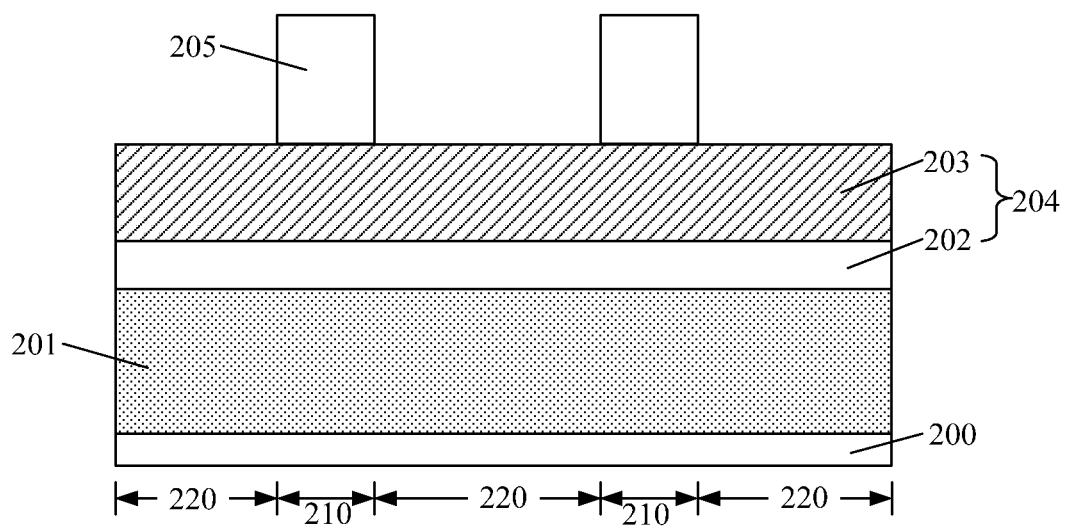
FIG. 4 illustrates a cross-section view of the semiconductor device illustrated in FIG. 3.
Figure 5:
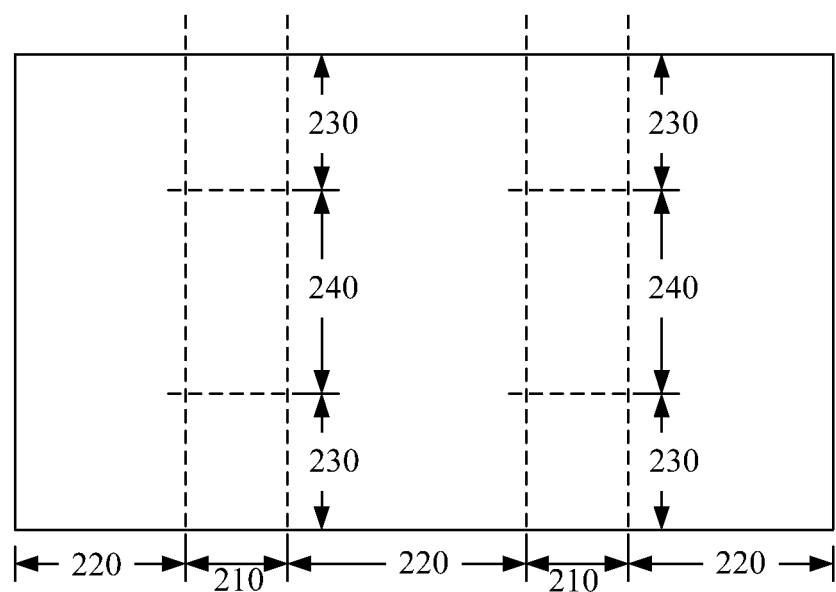
FIG. 5 illustrates a back view of the semiconductor device illustrated in FIG. 3.

As shown in FIG. 19, at the beginning of the fabrication process, a substrate is provided. A gate electrode film is formed on the substrate and a gate electrode pattern film is formed on the gate electrode film (S101). FIGS. 3 to 5 illustrate corresponding views of the semiconductor structure.

As shown in FIGS. 3 to 5, FIG. 3 is a three dimensional view of the semiconductor structure; FIG. 4 is a cross-section view of the semiconductor structure along an AA1 direction; and FIG. 5 is a top view of the substrate 200. At the beginning of the fabrication process, a substrate 200 may be provided. A gate electrode film 201 may be formed on the substrate 200 and a gate electrode pattern film 204 may be formed on the gate electrode film 201.

In certain embodiments, the substrate includes fins formed on the surface of the substrate, and an isolation layer covering the substrate and portions of the sidewalls of the fins. A top surface of the isolation layer being lower than a top surface of a fin.

In one embodiment, as shown in FIGS. 3 to 5, the substrate 200 may include a plurality of gate electrode regions 210 and a plurality of doped regions 220. A doped region 220 may be formed between two adjacent gate electrode regions 210. Specifically, a gate electrode region 210 may include a plurality of active areas 230 (AAs) and isolation regions 240.

Each isolation region 240 may connect two adjacent active areas 230. The active areas 230 and the isolation regions 240 may be arranged in an alternating manner to form a gate electrode region 210. An active area 230 may be formed between two adjacent isolation regions 240 and vice versa. The width of the gate electrode region 210 may be equal to the width of an active area 230 and the width of an isolation region 240, all being W. Specifically, the doped regions 220 may be used to form the source and the drain regions of the semiconductor structure.

First isolation structures may be formed in the doped regions 220 to provide electrical isolation between adjacent source region and drain region. A second isolation structure may be formed in the isolation regions 240 to provide electrical isolation between adjacent active areas 230 such that adjacent active areas 230 are insulated to each other. The first direction oa may be the direction pointing from one doped region 220 to an adjacent doped region 220. The first direction 'oa' may also refer to the direction of subsequently-formed channels in the substrate 200, i.e., channel length direction. The second direction may be a direction perpendicular to the first direction 'oa'.

A subsequently-formed gate electrode may cover an active area 230 and portions of adjacent isolation regions 240 (i.e., surfaces of some second isolation structures) connecting the active areas 230 and expose surfaces of adjacent doped regions 220. Orthogonal projection of the subsequently-formed second pattern layer on the substrate 200 may cover the doped regions 220.

In one embodiment, the substrate 200 may be a planar substrate. The substrate 200 may be made of silicon, SiGe, SiC, silicon on insulator (SOI), germanium on insulator (GOI), glass, and/or III-V compound (e.g., GaN or GaAs).

In another embodiment, the substrate may include a substrate layer and fins formed on the substrate layer. The substrate may also include an isolation layer formed on the substrate. The isolation layer may cover the sidewalls of some fins. The surface of the isolation layer may be lower than the top surfaces of the fins. The subsequently-formed gate electrode film may cover sidewalls and top surfaces of the fins. The gate electrode film may also cover the isolation layer.

The gate electrode film 201 may provide a base for the subsequent fabrication of the gate electrodes. The gate electrode film 201 may be made of poly-silicon or doped poly-silicon. The gate electrode film 201 may be formed by a chemical vapor deposition process, a physical vapor deposition process, and/or an atomic layer deposition process.

A gate dielectric film (not shown) may be formed on the substrate 200 for the subsequent formation of gate dielectric layer. The gate dielectric film may be made of silicon dioxide, silicon nitride, and/or silicon oxynitride. The gate electrode pattern film 204 may provide a base for the subsequent fabrication of the gate electrode pattern layer such that the pattern of the gate electrodes may be transferred to the gate electrode pattern layer. The gate electrode pattern layer may be used as an etch mask to etch the gate electrode film 201 and form gate electrodes. The first pattern layer may be formed on the gate electrode pattern film 204. Orthogonal projection of the first pattern layer on the substrate 200 may cover the gate electrode regions 210 such that the first pattern layer may be used as the etch mask to etch portions of the gate electrode pattern film 204 on the doped regions 220. An initial gate electrode pattern layer may be formed covering the gate electrode regions 210.

As mentioned above, after forming the initial gate electrode pattern layer, by using the first pattern layer as the etch mask to etch the gate electrode pattern film 204, the initial gate electrode pattern layer may have rough sidewalls. Sidewalls of the second gate electrode pattern may also be rough. Thus, the subsequently-formed gate electrodes may have degraded or poor quality.

Thus, the present disclosure provides a multiple-layered gate electrode pattern film 204. The gate electrode pattern film 204 may include a hard mask material layer 202 covering the gate electrode film 201 and a silicon material layer 203 on the hard mask material layer 202. The hard mask material layer 202 may be made of one or more of silicon dioxide, silicon nitride, silicon oxynitride, silicon carbide, silicon oxycarbide, SiOCN, and amorphous carbon. The silicon material layer 203 may be made of single silicon, poly-silicon, and/or amorphous silicon. The hard mask material layer 202 may be used for forming the initial hard mask layer of the initial gate electrode pattern layer and for forming the hard mask layer of the gate electrode pattern layer. The silicon material layer 203 may be used for forming the initial silicon layer of the initial gate electrode pattern layer and for forming the silicon layer of the gate electrode pattern layer. The arrangement described above may include several advantages.

In one aspect, because the silicon material layer 203 may be made of single silicon, poly-silicon, and/or amorphous silicon, portions of the sidewalls of the subsequently formed initial gate electrode pattern layer may also be made of single silicon, poly-silicon, and/or amorphous silicon. After using a chemical downstream etching process to etch the sidewalls of the initial gate electrode pattern layer, sidewalls of the first gate electrode pattern, made of silicon, may be repaired such that the a portion of the initial gate electrode pattern layer may have smooth sidewalls. The subsequently-formed silicon layer in the gate electrode pattern layer may thus have desirably smooth sidewalls.

Also, in one embodiment, the silicon material layer 203 may be formed on the hard mask material layer 202. When the gate electrode film 201 is etched subsequently, the silicon layer may be used as the etch mask for the etching process. Thus, the gate electrodes formed may have desirably smooth sidewalls.

In another aspect, because the silicon material layer 203 may be made of single silicon, poly-silicon, and/or amorphous silicon, when the gate electrode film 201 is subsequently etched, the silicon layer may also be etched by the etching process. By measuring the thickness of the silicon layer removed by the etching process, the thickness of the gate electrode film 201 removed by the etching process may be estimated or obtained. Thus, the end-point of the main etch process to etch the gate electrode film 201 may be obtained.

If the silicon material layer 203 is overly thin, when the silicon layer is being etched or removed, it might be difficult to detect the end-point of the main etch process for etching the gate electrode film 201 based on the etched condition of the silicon layer. Also, when the silicon layer, subsequently used as the etch mask to etch the gate electrode film 201, is overly thin, the hard mask layer 202 may be used as the etch mask to etch the remaining gate electrode film 201. The sidewalls of a gate electrode formed by the process described above may also have considerably high Poly LWR.

If the silicon material layer 203 is overly thick, when the silicon layer is subsequently etched, the end-point of the main etch process for etching the gate electrode film 201 may have already been reached before the silicon layer is removed. As a result, it might also be difficult to detect the end-point of the main etch process for etching the gate electrode film 201, and the electrical properties and performance of the semiconductor structure may be adversely affected.

Thus, in one embodiment, the thickness of the silicon material layer 203 may be greater than the thickness of the hard mask material layer 202 but less than the thickness of the gate electrode film 201. Based on requirements on semiconductor fabrication, after the thickness of the gate electrode film 201 is determined, the thickness of the gate electrode film 201 to be removed by the subsequent main etch process may be determined. Accordingly to the thickness of the gate electrode film 201 to be removed, the thickness of the silicon material layer 203 may be determined. The thickness of the silicon material layer 203 may be equal to the thickness of the gate electrode film 201 to be removed by the main etch process. That is, the thickness of the silicon material layer 203 may be dependent on the thickness of the gate electrode film 201 to ensure the end-point of the main etch process is properly detected.

Referring to FIGS. 3 to 5, the first pattern layer 205 may be formed on the gate electrode pattern film 204. Patterns of the first pattern layer 205 may be arranged parallel to the first direction 'oa'. Surface of a portion of electrode pattern film 204 between two adjacent patterns of the first pattern layer 205 may be exposed.

The first pattern layer 205 may be subsequently used as an etch mask for etching the gate electrode film 204 to form the initial gate electrode pattern layer. Orthogonal projection of the first pattern layer 205 on the substrate 200 may cover the gate electrode regions 210. That is, the first pattern layer 205 may cover the portions of the gate electrode pattern film 204 on the gate electrode regions 210 and expose the portions of the gate electrode pattern film 204 on the doped regions 220. The first pattern layer 205 may define the distance between two adjacent doped regions 220 of the semiconductor structure. The distance between two adjacent patterns of the first pattern layer 205 may be equal to the length of a doped region 220.

Because an etch-repairing treatment may be performed to repair sidewalls of the initial silicon layer, the widths of the patterns of the initial silicon layer along the channel length direction (e.g., the first direction 'oa') may decrease. To prevent adverse effect caused by the decreased widths of the patterns of the initial silicon material layer, in one embodiment, the width of a pattern of the first pattern layer 205 may be greater than the width between two adjacent doped regions 220. That is, the width of a pattern of the first pattern layer 205 may be greater than the width of a gate electrode region 210. Specifically, the width may refer to the width along the first direction 'oa'.

If the difference between the width of the pattern of the first pattern layer 205 and the width of the gate region 210 is overly small, after the initial silicon layer is repaired by the etch-repairing treatment, the width of a pattern of the initial silicon layer may be undesirably small, causing the subsequently-formed gate electrode to have an undesirably small width along the channel length direction.

However, if the difference between the width of the pattern of the first pattern layer 205 and the width of the gate region 210 is overly large, after the initial silicon layer is repaired by the etch-repairing treatment, the width of a pattern of the initial silicon layer may be undesirably large, causing the subsequently-formed gate electrode to have an undesirably large width along the channel length direction. Thus, in one embodiment, the difference between the width of the pattern of the first pattern layer 205 and the width of the gate region 210 may be between about 5 Å to about 50 Å. In other various embodiments, the width of a pattern of the first pattern layer 205 may be the same as the width of the gate electrode region and/or the width of the active area.

The first pattern layer 205 may be made of photoresist. To form the first pattern layer 205, a photoresist film may be formed to cover the gate electrode pattern film 204. A photolithography process may be used to expose and develop the photoresist film to form the first pattern layer 205 on the gate electrode pattern film 204.

In one embodiment, before the photoresist film is formed, a layer of bottom antireflective coating (Barc) may be formed on the gate electrode pattern film 204 to improve the precision of the photolithography process for forming the first pattern layer 205. In other various embodiments, before the photoresist film is formed, a layer of organic coating may be formed on the gate electrode pattern film 204. After the photoresist film is formed, a layer of top antireflective coating may be formed on the photoresist film.

Because the first pattern layer 205 may cover the entire gate regions 210, compared to a conventional photoresist layer used for defining the gate electrode pattern, the patterns of the first pattern layer 205 formed in one embodiment may have larger sizes. Thus, shapes and morphology of the patterns of the first pattern layer 205 may be better. However, the formation of the first pattern layer 205 may still be limited by various fabrication constraints (e.g., photolithography limits) and sidewalls of the first pattern layer 205 may not be perfectly smooth. Thus, sidewalls of the first pattern layer 205 may have certain level of Poly LWR.

Figure 6:
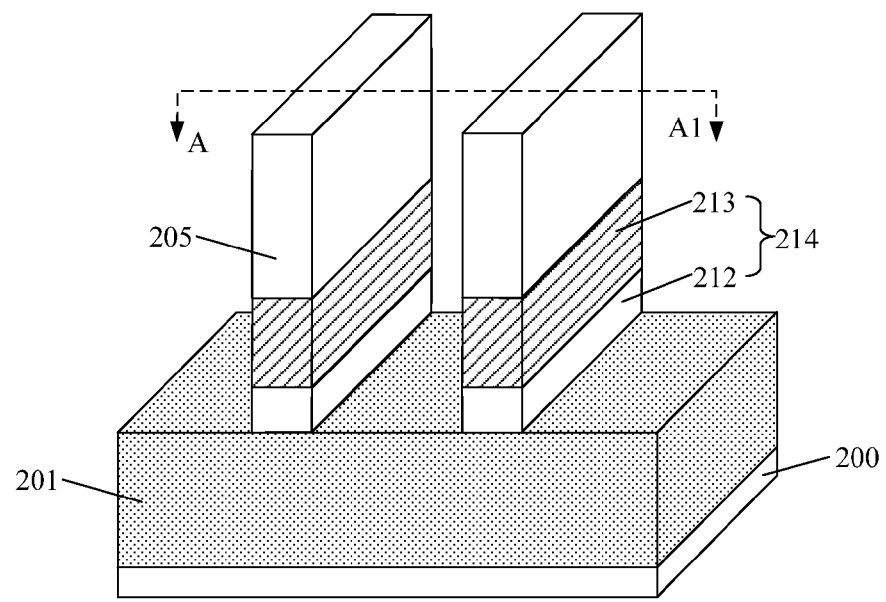
FIG. 6 illustrates an exemplary semiconductor device corresponding to another stage of an exemplary fabrication process consistent with the disclosed embodiments.
Figure 7:
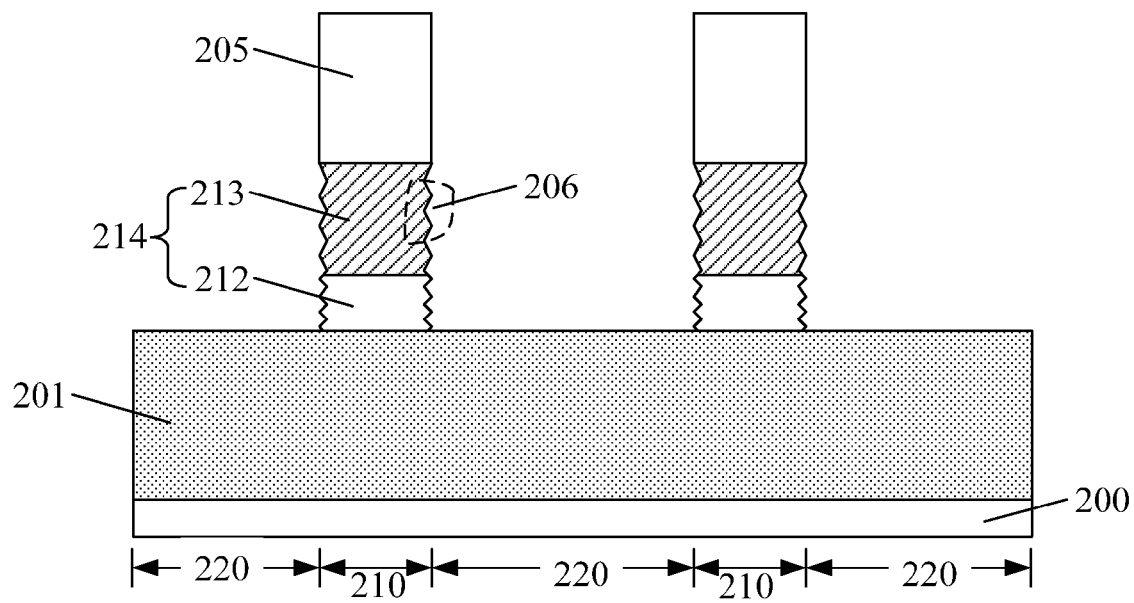
FIG. 7 illustrates a cross-section view of the semiconductor device illustrated in FIG. 6.

Referring to FIG. 19, after the substrate is provided with the gate electrode film formed on the substrate and the gate electrode pattern film formed on the gate electrode film, the first pattern layer is used as the etch mask to etch portions of the gate electrode pattern film to expose portions of the gate electrode film. An initial gate electrode pattern layer with separated patterns is formed to include an initial hard mask layer and an initial silicon layer (S102). FIGS. 6 to 7 illustrate corresponding views of the semiconductor structure.

As shown in FIGS. 6 to 7, FIG. 6 illustrates a three dimensional view of the semiconductor structure, and FIG. 7 illustrates a cross-section view of the semiconductor structure along an AA1 direction. The first pattern layer 205 may be used as the etch mask to etch portions of the gate electrode pattern film 204 (as shown in FIGS. 3 to 4) to expose portions of the gate electrode film 201. An initial gate electrode pattern layer 214 with separated patterns may be formed on the gate electrode film 201. The initial gate electrode pattern layer 214 may include an initial hard mask layer 212 and an initial silicon layer 213 formed on the initial hard mask layer 212.

Specifically, patterns of the first pattern layer 205 may be transferred to the gate electrode pattern film 204 such that the formed initial gate electrode pattern layer 214 may define the distance between two adjacent doped regions 220 in the semiconductor structure. That is, dimension of the subsequently-formed gate electrode along the channel length direction (i.e., the first direction 'oa') may be defined. The dimension may ensure the subsequently-formed gate electrodes expose the doped regions 220 and cover the active areas 230.

A dry etch process may be used to etch the gate electrode pattern film 204. Orthogonal projection of the initial gate electrode pattern layer 214 on the substrate 200 may cover the gate regions 210 and expose the doped regions 220. Limited by the sidewall morphology of the first pattern layer 205 and limitations of the dry etch process, sidewalls of the formed initial gate electrode pattern layer 214 may have certain level of Poly LWR. The sidewalls of the initial silicon layer 213 along a direction perpendicular to the first direction 'oa' may have a first Poly LWR 206, as shown in FIG. 7. If the gate electrode pattern layer is subsequently formed directly based on the initial gate electrode pattern layer 214, the sidewalls of the gate electrode pattern layer 214 may also have undesirably high Poly LWR. The high Poly LWR may affect the quality of the subsequently-formed gate electrodes. A subsequently-formed channel region may have a varying length corresponding to different regions of the corresponding gate electrode.

Thus, in one embodiment, an etch-repairing treatment may be subsequently performed to repair sidewalls of the initial gate electrode pattern layer 214 to reduce the Poly LWR of the sidewalls of the initial gate pattern layer 214. The smoothness of the sidewalls of the initial gate electrode pattern layer 214 may be improved and quality of the subsequently-formed gate electrodes may be improved accordingly.

Figure 8:
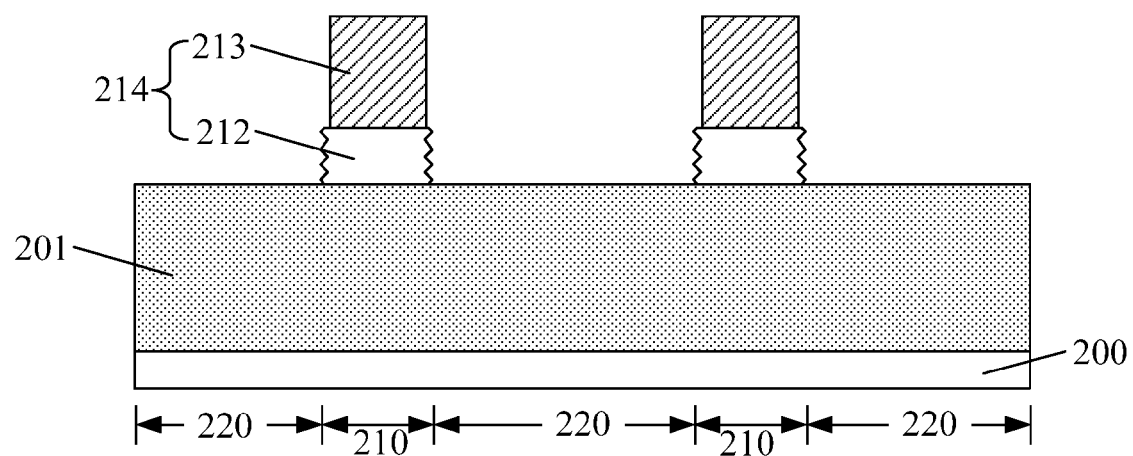
FIG. 8 illustrates an exemplary semiconductor device corresponding to another stage of an exemplary fabrication process consistent with the disclosed embodiments.

Referring to FIG. 19, after portions of the gate electrode pattern film are etched and the initial gate electrode pattern layer are formed, the sidewalls of the initial gate electrode pattern layer are treated with an etch-repairing treatment (S103). FIG. 8 illustrates a corresponding view of the semiconductor structure.

As shown in FIG. 8, FIG. 8 illustrates a cross-section view of the semiconductor structure based on FIG. 7. The sidewalls of the initial gate electrode pattern layer 214 may be treated with an etch-repairing treatment such that sidewalls of the initial gate electrode pattern layer 214 may have second Poly LWR. The second Poly LWR may be lower than the first Pol LWR.

Figure 9:
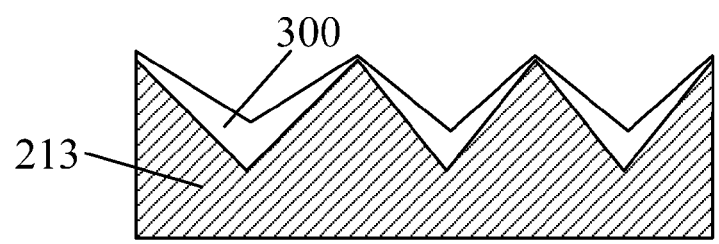
FIG. 9 illustrates an enlarged view of a portion of the semiconductor device illustrated in FIG. 8.

Repairing the sidewalls of the initial gate pattern layer 214 with the etch-repairing treatment may actually be repairing the sidewalls of the initial silicon layer 213 so that the sidewalls of the initial silicon layer 213 may have second Poly LWR, which is lower than the first Poly LWR. In one embodiment, the etch-repairing treatment is illustrated using the saw-toothed or zig-zag sidewalls of the initial silicon layer 213 before the etch-repairing treatment, as shown in FIG. 9. In FIG. 9, an enlarged portion of the semiconductor structure illustrated in FIG. 8 is shown. As shown in FIG. 9, sidewalls of the initial silicon layer 213 may include protruding areas and recessed areas corresponding to the protruding areas.

A chemical downstream etch (CDE) may be used for the etch-repairing treatment. Specifically, in the etch-repairing treatment, a passivation film 300 may be formed on the protruding areas and recessed areas. The thickness of the passivation film 300 on the protruding areas may be much less than the thickness of the passivation film 300 on the recessed areas. A gas may be generated during the etch-repairing treatment to etch the passivation film 300 until the passivation film 300 is fully removed. Because the thickness of the passivation film 300 on the recessed areas are much greater than the thickness of the passivation film 300 on the protruding areas, and the etch-repairing treatment may also etch silicon, the gas may etch the protruding areas of the silicon layer 213 when the passivation film 300 is being removed. Thus, a protruding area may have a reduced dimension or height. The fabrication steps of forming or depositing the passivation film 300, etching to remove the passivation film 300, and etching to remove the protruding areas may be performed repeatedly until sidewalls of the initial silicon layer 213 become smooth.

The passivation film 300 may be made of SiOF. The SiF gas may be generated from the etchant gas of the CDE etching the silicon. The SiF gas may etch the passivation film 300 and protruding areas of the sidewalls of the initial silicon layer 213 simultaneously.

The etchant gases of the chemical downstream etch may include a fluorine-source gas and an oxygen-source gas. If the flow rate of the fluorine-source gas is overly high, an excessive amount of SiF may be formed, and the etch rate on the protruding areas of the sidewalls of the initial silicon layer 213 may be undesirably high. If the flow rate of the oxygen-source gas is overly high, the oxidized portions of the sidewalls of the initial silicon layer 213, by the oxygen-source gas, may be overly thick. If the flow rates of the etchant gases are overly low, the passivation film 300 may be undesirably thin, causing the SiF gas to etch the silicon of the recessed areas. If the etching temperature in the reaction chamber is overly high, the etching rate on the protruding areas may be undesirably high.

Thus, in one embodiment, the parameters of the chemical downstream etch process may include etchant gases of a $CF_4$ gas and an $O_2$ gas, a flow rate of the $CF_4$ being about 100 sccm to about 1000 sccm and a flow rate of the $O_2$ being about 5 sccm to about 100 sccm; an etch source power of about 100 W to about 2000 W; a reaction chamber temperature of about 0 degrees Celsius to about 200 degrees Celsius; and an etching time of about 10 seconds to about 60 seconds.

After the etch-repairing treatment, the sidewalls of the initial silicon layer 213 may have the second Poly LWR, which is lower than the first Poly LWR. Thus, the smoothness of the sidewalls of the subsequently-formed gate electrode pattern layer can be improved. Quality of the gate electrodes to be formed may be improved accordingly.

In one embodiment, when the initial silicon layer 213 is being treated with the etch-repairing treatment, the first pattern layer 205 (as shown in FIGS. 6 and 7) may cover the initial gate electrode pattern layer 214 to prevent the etch-repairing treatment from etching the top surface of the initial silicon layer 213. The thickness of the initial silicon layer 213 may maintain consistent with the thickness of the silicon material layer 203. After repairing the sidewalls of the initial silicon layer 213 with the etch-repairing treatment, the first pattern layer 205 may be removed by a wet stripping process and/or an ashing process.

In other various embodiments, the first pattern layer 205 may also be removed before the etch-repairing treatment. Because it has been known from the working mechanism of the etch-repairing treatment that, during the etch-repairing treatment, a passivation film, with a considerable thickness, may be formed on the top surface of the initial silicon layer 213. Thus, little or no etching can be caused on the top surface of the initial silicon layer by the etch-repairing treatment.

Figure 10:
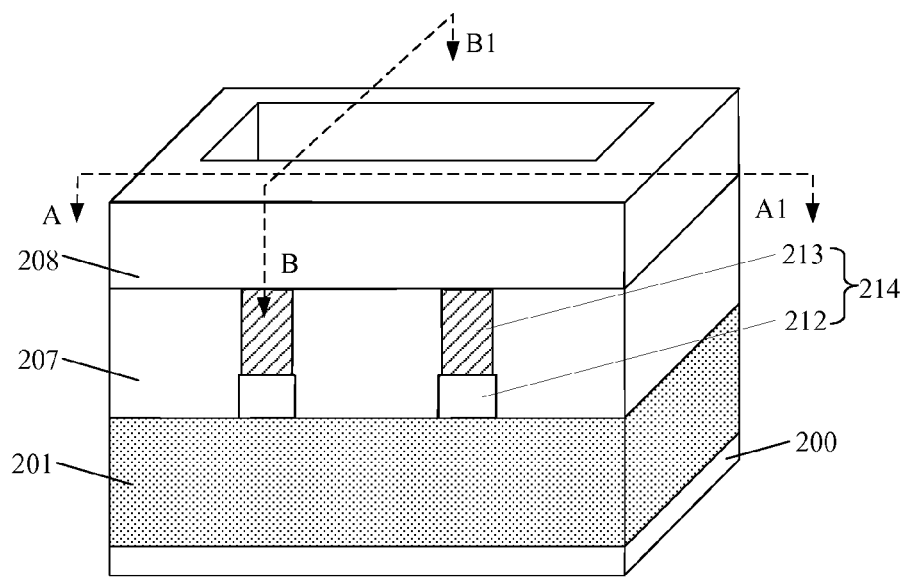
FIG. 10 illustrates an exemplary semiconductor device corresponding to another stage of an exemplary fabrication process consistent with the disclosed embodiments.
Figure 11:
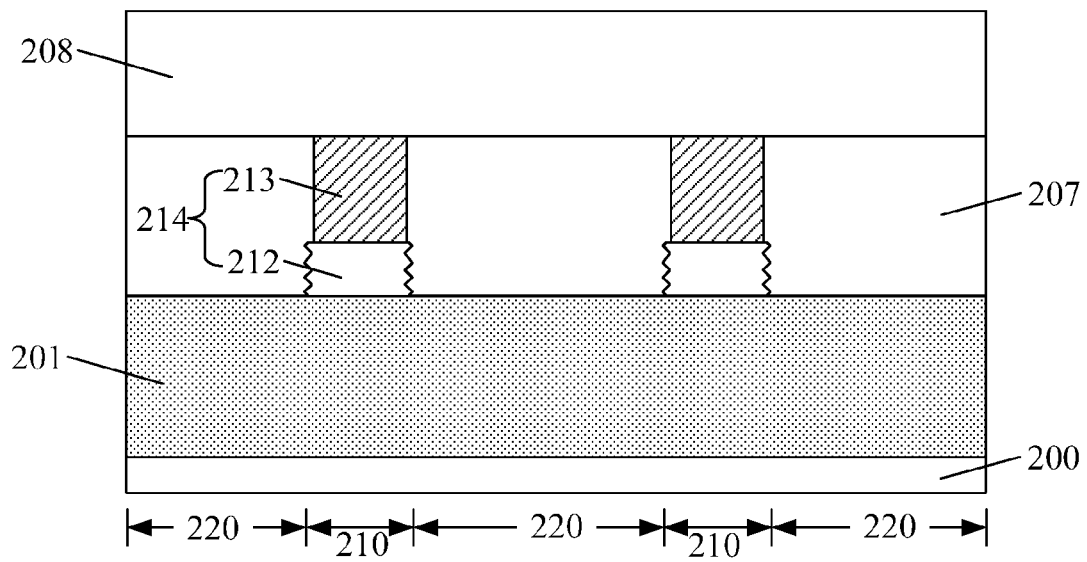
FIG. 11 illustrates a cross-section view of the semiconductor device illustrated in FIG. 10.
Figure 12:
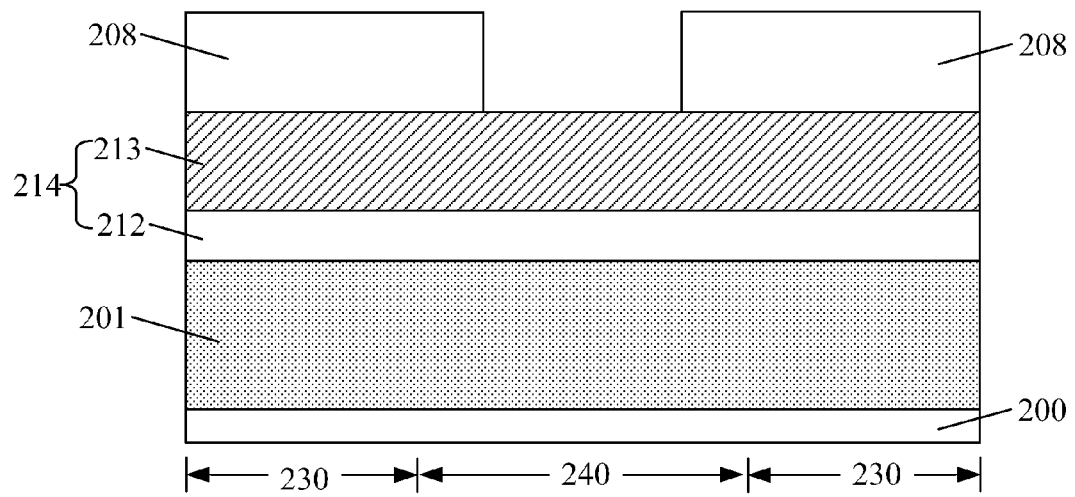
FIG. 12 illustrates another cross-section view of the semiconductor device illustrated in FIG. 10.

Referring to FIG. 19, after the sidewalls of the initial gate electrode pattern layer are treated with the etch-repairing treatment, a second pattern layer is formed on the initial gate electrode pattern layer along a second direction, perpendicular to the first direction. A portion of the initial gate electrode pattern layer between two adjacent patterns of the second pattern layer may be exposed (S104). FIGS. 10 to 12 illustrate corresponding views of the semiconductor structure.

As shown in FIGS. 10 to 12, FIG. 10 is a three dimensional illustration of the semiconductor structure, FIG. 11 is a cross-section view of the semiconductor structure illustrated in FIG. 10 along an AA1 direction, and FIG. 12 is a cross-section view of the semiconductor structure illustrated in FIG. 10 along a BB1 direction. After performing the etch-repairing treatment on the sidewalls of the initial silicon layer 213, a second pattern layer 208 may be formed on the initial gate electrode pattern layer 214 along a second direction. Patterns of the second pattern layer 208 may be arranged parallel to the second direction. A portion of the initial gate electrode pattern layer 214 may be exposed between two adjacent patterns of the second pattern layer 208. The second direction may be perpendicular to the first direction.

The second pattern layer 208 may be used as the etch mask to subsequently pattern the initial gate electrode pattern layer 214 and define the location of the heads of the gates. The second pattern layer 208 may be used to the initial gate electrode pattern layer 214 and form the gate electrode pattern layer with a plurality of separated patterns. The separated patterns of the gate electrode pattern layer may expose portions of the isolation regions 240 so that subsequently-formed heads of gate electrodes may be formed on the second isolation structure to prevent leakage current in the semiconductor structure when in operation.

Orthogonal projection of the second pattern layer 208 on the substrate 200 may cover the active areas 230 and portions of the isolation regions 240 adjacent to the active areas 230. Orthogonal projection of the patterns of the second pattern layer 208 on the substrate 200 may be perpendicular to the orthogonal projection of the patterns of the first pattern layer 205 on the substrate 200.

In one embodiment, to reduce the fabrication difficulty in forming the second pattern layer 208 and to improve the shapes and morphology of the second pattern layer 208, orthogonal projection of the second pattern layer 208 on the substrate 200 may cover the doped regions 220. In other various embodiments, orthogonal projections of the second pattern layer 208 may not cover the doped regions 220. Before the second pattern layer 208 is formed, an organic polymer layer 207 (not shown) may be sprayed or spin-coated on the gate electrode film 201 to cover the gate electrode film 201 and sidewalls of the initial gate electrode pattern layer 214. After the organic polymer layer 207 is formed, the second pattern layer 208 may be formed. The organic polymer layer 207 may be made of a material for forming the Barc or other silicon-containing polymer materials.

The second pattern layer 208 may be made of photoresist. The fabrication steps to form the second pattern layer 208 may be referred to the fabrication steps of the first pattern layer 205 and is not repeated herein.

Figure 13:
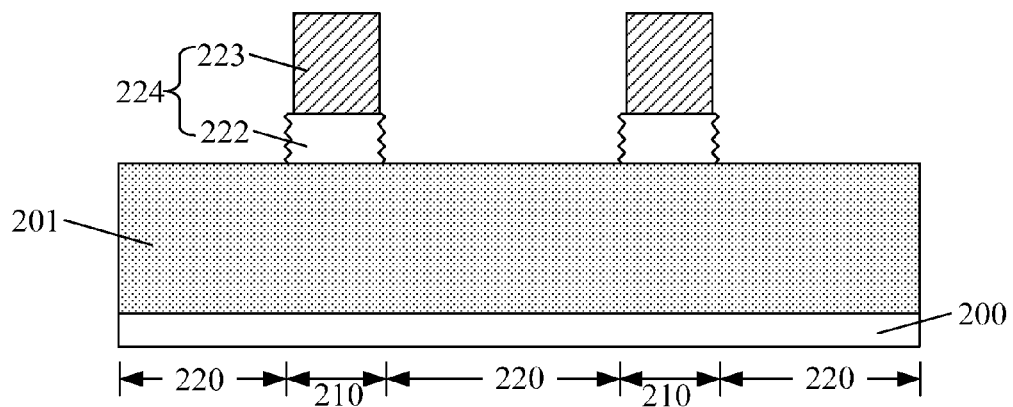
FIG. 13 illustrates the cross-section view of an exemplary semiconductor device corresponding to another stage of an exemplary fabrication process consistent with the disclosed embodiments.
Figure 14:
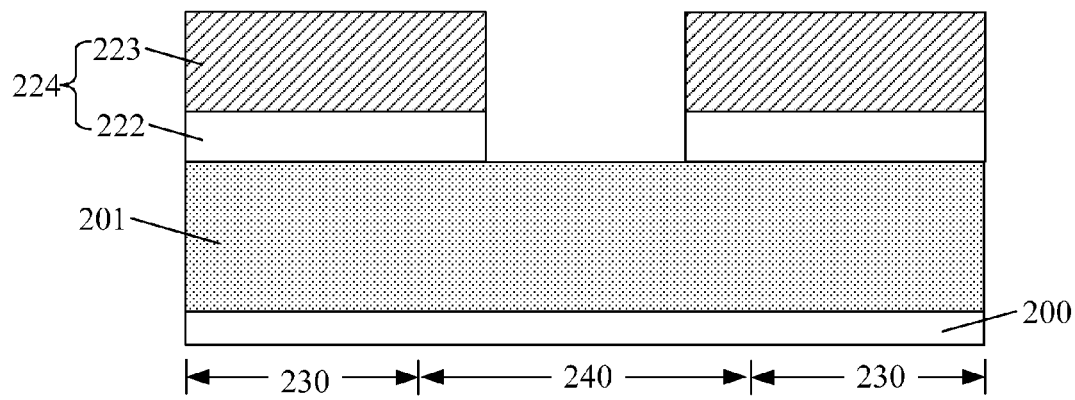
FIG. 14 illustrates another cross-section view of the semiconductor device illustrated in FIG. 13.

Referring to FIG. 19, after the second pattern layer 208 is formed on the initial gate electrode pattern layer to expose portions of the initial gate electrode pattern layer between adjacent patterns of the second pattern layer, the second pattern layer is used as the etch mask to etch the exposed portions of the initial electrode pattern layer to expose the gate electrode film and form the gate electrode pattern layer with separated patterns on the gate electrode film (S105). FIGS. 13 to 14 illustrate corresponding views of the semiconductor structure.

As shown in FIGS. 13 to 14, the second pattern layer 208 (as shown in FIGS. 10 to 12) may be used as the etch mask to etch the exposed portions of the initial gate electrode pattern layer 214 until the gate electrode film 201 are exposed and gate electrode pattern layer 224 with separated patterns on the gate electrode film 201. The gate electrode pattern layer 224 may include a hard mask layer 222 and a silicon layer 223 formed on the hard mask layer 222.

A dry etch process may be used to etch the initial gate electrode pattern layer 214. The sidewalls of the silicon layer 223 may have second Poly LWR, which is lower than the first Poly LWR. Specifically, a sidewall having second Poly LWR may refer to a sidewall of the silicon layer 223 in a direction perpendicular to the channel length direction. The second Poly LWR may be considerably lower or even zero. Thus, the sidewalls of the silicon layer 223 in the direction perpendicular to the channel length may be smooth.

Gate electrode pattern layer 224 may be formed on the gate electrode film 201 corresponding to the gate electrode regions 210. The gate electrode pattern layer 224 may expose portions of the gate electrode film 201 on the isolation regions 204. The gate electrode pattern layer 224 may define the locations of the heads of the subsequently-formed gate electrodes.

In one embodiment, when the second pattern layer 208 is used as the etch mask to etch the initial gate electrode pattern layer 214, the sidewalls of the corresponding gate electrode pattern layer 224 may have certain level of Poly LWR in a direction parallel to the first direction. The sidewalls of gate electrode pattern layer 224, with certain level of Poly LWR, may define the locations of the heads of the subsequently-formed gate electrodes. The surface roughness of the sidewall of the head of a gate electrode may have little correlation to the corresponding channel length. A considerably large distance should be formed between the head of a gate electrode and active areas 230 to prevent leakage current from forming in the subsequently-formed gate electrode.

Thus, in one embodiment, even if the sidewalls of the gate electrode pattern layer 224 may have certain level of Poly LWR using the second pattern layer 208 as the etch mask, no etch-repairing treatment is needed for the sidewalls of the gate electrode pattern layer 224 for defining the locations of the heads of the subsequently-formed gate electrodes. Thus, undesirably short distance between the subsequently-formed head of a gate electrode and an active areas 230 caused by the etch-repairing treatment may be prevented. Leakage current in the subsequently-formed gate electrode may be prevented accordingly.

Thus, after the initial gate electrode pattern layer 214 is formed, the sidewalls of the initial silicon layer 213 in a direction perpendicular to the first direction may be treated using the etch-repairing treatment such that sidewalls of the initial silicon layer 213 may have second Poly LWR. Etch-repairing treatment on the sidewalls of the silicon layer 223 in a direction parallel to the first direction should be avoided to prevent undesirably short distance from forming between the head of the a subsequently-formed gate electrode and adjacent active areas.

After the gate electrode pattern layer 224 is formed, the second pattern layer 208 and the organic polymer layer 207 may be removed. An ashing process may be used to remove the second pattern layer 208 and the organic polymer layer 207.

The gate electrode pattern layer 224 may be used subsequently as the etch mask to etch the gate electrode film 201 to expose surfaces of the portions of the substrate 200. Gate electrodes may be formed on the substrate 200.

Figure 15:
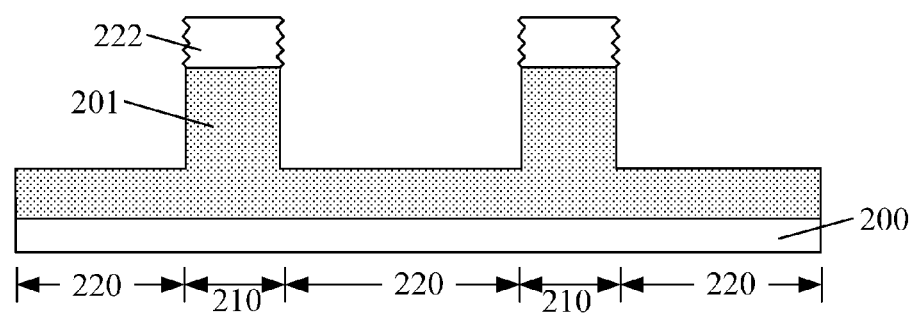
FIG. 15 illustrates the cross-section view of an exemplary semiconductor device corresponding to another stage of an exemplary fabrication process consistent with the disclosed embodiments.
Figure 16:
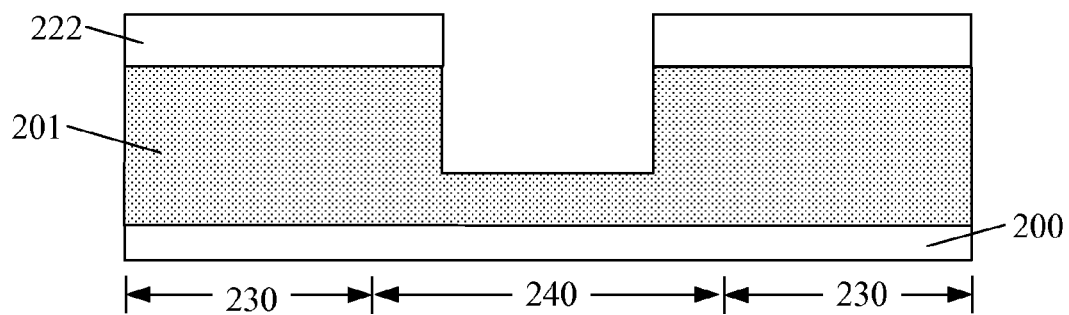
FIG. 16 illustrates a cross-section view of the semiconductor device illustrated in FIG. 15.

Referring to FIG. 19, after the gate electrode pattern layer with separated patterns are formed on the gate electrode film, the gate electrode pattern layer is used as the etch mask to etch and remove a portion of the total thickness of the gate electrode film (S106). FIGS. 15 to 16 illustrate corresponding views of the semiconductor structure.

As shown in FIGS. 15 to 16, the gate electrode pattern layer 224 (as shown in FIGS. 13 to 14) may be used as the etch mask for the main etch process to etch and remove a portion of the total thickness of the gate electrode film 201. The main etch process may also etch the silicon layer 223 (as shown in FIGS. 13 to 14).

In one embodiment, the gate electrode film 201 may be etched by using the silicon layer 223 in the gate electrode pattern layer 224 as the etch mask in the main etch process. The etch-repairing treatment performed previously may enable the sidewalls of the silicon layer 223 to have low Poly LWR or even smooth surfaces. Thus, after the main etch process performed on the gate electrode film 201 using the silicon layer 223 as the etch mask, the corresponding sidewalls of the gate electrode film 201 in a direction perpendicular to the first direction may also have desirably low Poly LWR. The gate electrode film 201 may also have smooth sidewalls after the main etch process.

The sidewalls of the gate electrode film 201 after the main etch process may determine the final shapes and morphology of the subsequently-formed gate electrodes. In one embodiment, because the sidewalls of the gate electrode film 201 may have low Poly LWR or even smooth surfaces after the main etch process, the sidewalls of the subsequently-formed gate electrodes, formed after etching the remaining gate electrode film 201, may also have low Poly LWR or even smooth surfaces. Quality of the gate electrodes to be formed may be improved.

The main etch process may be a dry etch process. The etchant gases of the main etch process may include $SF_6$, $CF_4$, and/or $CH_2F_2$. In a process to fabricate gate electrodes, a main etch process with low etch selectivity and high etch rate, and/or an over etch process with high etch selectivity and low etch rate may be commonly selected. If the end-point of the main etch process is not properly detected, damages caused by the etching of unnecessary parts or regions may occur. For example, the gate dielectric film under the gate electrode film 201 may be etched or damaged. Thus, it is desired to accurately detect the end-point of the main etch process in the fabrication process in order to stop the main etch process at a proper time.

When the main etch process reaches the end-point, the main etch process may be stopped. In one embodiment, an interferometry end point (IEP) method or an optical emission spectroscopy (OES) method may be used to detect the end-point of the main etch process. The IEP method refers to using a laser light source to detect thickness variations of the gate electrode film 201 in order to detect the end-point of the main etch process. The OES method refers to using the intensity variations of an emitted wavelength by a reactive chemical group and/or by a volatile group to detect the end-point of the main etch process.

Because the IEP method may be susceptible to the morphology of the surface of the substrate 200, the end-point of the main etch process detected using the IEP method may not be accurate. In one embodiment, the OES method may be used to detect the end-point of the main etch process. When the main etch process reaches the end-point, the silicon layer 223 may be fully removed to expose the surface of the hard mask layer 222. The gas composition generated from the main etch process etching the silicon layer 223 may be different from the gas composition generated from the main etch process etching the hard mask layer 222. The difference in the gas composition may be reflected in the intensity variation of the OES spectrum. The end-point of the main etch process may thus be detected.

In one embodiment, the thickness of the silicon layer 223 may be equal to the thickness of the gate electrode film 201 removed by the main etch process. When a difference of gas composition in the main etch process is detected, the main etch process may be stopped. That is, when the silicon layer 223 is removed to expose the hard mask layer 222 by the main etch process, the end-point of the main etch process is reached and the main etch process may be stopped.

In one embodiment, the OES method may be used to detect the end-point of the main etch process. When it is detected that the silicon layer 223 is fully removed, the main etch process may be stopped. Morphology of the substrate 200 may not affect the gas composition in the main etch process and the detection accuracy of the end-point may be improved. Damages to the gate dielectric film under the gate electrode film 201, caused by the main etch process, may be prevented or reduced to improve the electrical properties and performance of the semiconductor structure.

Figure 17:
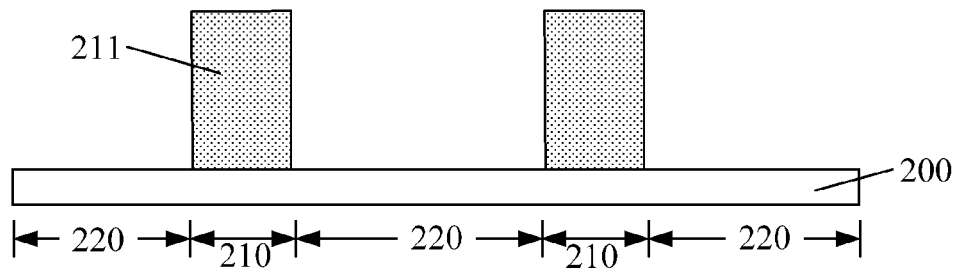
FIG. 17 illustrates the cross-section view of an exemplary semiconductor device corresponding to another stage of an exemplary fabrication process consistent with the disclosed embodiments.

Referring to FIG. 19, after the gate electrode pattern layer is used as the etch mask to etch and remove a portion of the total thickness of the gate electrode film, the gate electrode pattern layer is used as the etch mask to over etch and remove the remaining gate electrode film and form gate electrodes on the substrate (S107). FIGS. 17 to 18 illustrate corresponding views of the semiconductor structure.

As shown in FIGS. 17 to 18, the gate electrode pattern layer 224 (as shown in FIGS. 13 to 14) may be used as the etch mask to over etch and remove the remaining gate electrode film 201 (as shown in FIGS. 15 to 16) and form gate electrodes 211 on the substrate 200.

In one embodiment, the hard mask layer 222 in the gate electrode pattern layer 224 may be used as the etch mask for the over etch process. The shapes and morphology of the subsequently-formed gate electrodes 211 may be determined by the shape and morphology of the remaining gate electrode film 201. The sidewalls of the remaining gate electrode film 201 may have desirably low Poly LWR or even smooth surfaces after the previous main etch process. The sidewalls may refer to the sidewalls of the gate electrode film 201 in a direction perpendicular to the first direction. Accordingly, the sidewalls of the gate electrodes 211 formed after the over etch process may also have desirably low Poly LWR or even smooth surfaces. Thus, quality of the gate electrodes to be formed may be improved.

Because the over etch process is used to etch and remove the remaining gate electrode film 201 and expose the gate dielectric film under the gate electrode film 201 without damaging the gate dielectric film, the over etch process is required to have a high etch selectivity. Thus, in one embodiment, the over etch process may be an asynchronous pulse dry etch process to improve the etch selectivity of the over etch process.

As an embodiment, the parameters of the asynchronous pulse dry etch process may include etchant gases of an HBr gas, a $SiCl_4$ gas, and/or an $O_2$ gas. The flow rate of the HBr gas may be about 10 sccm to about 5000 sccm; the flow rate of the $SiCl_4$ gas may be about 5 sccm to about 100 sccm; and the flow rate of the $O_2$ gas may be about 5 sccm to about 100 sccm. The power of the power source may be about 500 W to about 2500 W; and the duty cycle of the power provided by the power source may be about 10% to about 80%. The bias power may be about 0 W to about 500 W; and the duty cycle of the bias power may be about 10% to about 80%. The pressure in the reaction chamber may be about 10 mTorr to about 200 mTorr; and the etching time may be about 10 seconds to about 600 seconds.

Further fabrication steps may include forming a source region and a drain region in the substrate 200, each on one side of the sidewall of a gate electrode 211, where the sidewall may be formed in a direction perpendicular to the first direction. That is, the source region and the drain region of a gate electrode may be formed in the corresponding doped regions 220. In one embodiment, because the formed gate electrodes may have improved quality, and the sidewall of each gate electrode 211 formed in a direction perpendicular to the first direction may have desirably low Poly LWR or even smooth surface, the distance between a drain region and the corresponding source region of each gate electrode 211 may be consistent after the source regions and the drain regions are formed. That is, the channel length of a semiconductor structure may have desirably improved consistency, i.e., a more symmetric gate profile and less kinks on the sidewalls of the gate electrodes. The formed semiconductor structure may therefore have improve electrical properties and performance.

In one embodiment, a double patterning method may be used to form the gate electrodes of the semiconductor structure. In other various embodiments, a pattern layer may also be formed on the gate electrode pattern film to directly define the shapes and patterns of gate electrodes to be formed. The pattern layer may be used as the etch mask to etch portions of the gate electrode pattern film to expose the portions of the gate electrode film and form the gate electrode pattern layer on the gate electrode film. The gate electrode pattern layer may include a hard mask layer and a silicon layer on the hard mask layer, and the sidewalls of the silicon layer in a direction perpendicular to the first direction may have a first Poly LWR.

An etch-repairing treatment may be used to treat the sidewalls of the silicon layer such that the sidewalls of the silicon layer in a direction perpendicular to the first direction may have a second Poly LWR, which is lower than the first Poly LWR. Using the gate electrode pattern layer as the etch mask to etch the gate electrode film until the portions of the substrate are exposed. Gate electrodes may be formed on the substrate. The source region and the drain region of each gate electrode may be formed in the substrate, each at one side of the sidewall in a direction perpendicular to the first direction. Detailed descriptions of the etch-repairing treatment and the gate electrode film etching process may be referred to previous descriptions and are not repeated herein.

Figure 20:
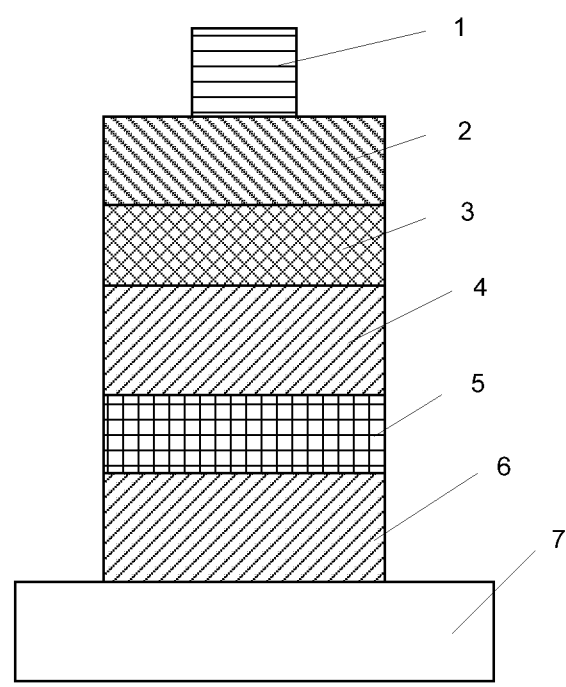
FIG. 20 illustrates an exemplary configuration of materials used in an exemplary fabrication process consistent with the disclosed embodiments.

FIG. 20 illustrates an exemplary configuration of the materials used in the embodiments. The configuration or stack 200 shown in FIG. 20 may be used to indicate different materials used in the fabrication process provided by the present disclosure. Some of the layers, in the stack, may be removed or etched after the fabrication process. The stack thus may not represent the materials or layers remained in the semiconductor devices after the fabrication process.

As shown in FIG. 20, layer 1 may be a photoresist layer for forming the first pattern layer 205. Layer 4 may be a poly-silicon layer for forming the silicon material film 203 in the gate electrode pattern film 204. Layer 2 may be a silicon-containing Barc (Si-Barc) layer formed between the first pattern layer 205 and the gate electrode pattern film 204, and layer 3 may be an optical development layer (ODL) formed between the first pattern layer 205 and the gate electrode pattern film 204. The Si-Barc layer 2 and the ODL 3 may be used to at least improve the photolithography accuracy when, for example, patterning the gate electrode pattern film. The ODL may be an organic polymer layer. The Si-Barc layer 2 may be formed on the ODL 3. Layer may be a dielectric antireflective coating (Darc) layer for forming the hard mask material film 202 in the gate electrode pattern film 204. Layer 6 may be a poly-silicon layer for forming the gate electrode film 201. Layer 7 may be the substrate or a fin structure formed on the substrate.

The materials or layers in the stack 200 may be processed to form the final semiconductor devices. The processing of the layers may be referred to the fabrication process aforementioned and are not repeated herein.

Compared to a conventional transistor, the fabrication method provided in the current disclosure has several advantages.

The present disclosure provides a method for fabricating a semiconductor structure. In the method, the gate electrode pattern film includes a hard mask material layer and a silicon material layer on the hard mask material layer. After the pattern layer is formed on the gate electrode pattern film, the pattern layer may be used as the etch mask to etch the gate electrode pattern film and form the gate electrode pattern layer on the gate electrode film. The gate electrode pattern layer includes a hard mask layer and a silicon layer on the hard mask layer. The sidewalls of the silicon layer in a direction perpendicular to the first direction may have a first Poly LWR. The first Poly LWR may be caused by fabrication limitations in the photolithography and etching processes. The sidewalls of the silicon layer in a direction perpendicular to the first direction may be treated with an etch-repairing treatment such that the treated sidewalls of the silicon layer may have a second Poly LWR, lower than the first Poly LWR. Thus, the sidewalls of a portion of the gate electrode pattern layer may have improved or reduced Poly LWR. The thickness of the portion of the gate electrode pattern layer may be a portion of the total thickness of the gate electrode pattern layer. The sidewalls of the gate electrodes pattern layer have a desirably low Poly LWR.

When the gate electrode pattern layer is used as the etch mask to etch the gate electrode film and form gate electrodes, because the a portion of the gate electrode pattern layer, having a thickness being a portion of the total thickness of the gate electrode pattern, has sidewalls with desirably low Poly LWR or even smooth surfaces in a direction perpendicular to the first direction, the gate electrodes, formed using the gate electrode pattern layer as the etch mask, may also have sidewalls with desirably low Poly LWR or even smooth surfaces. When the source region and the drain region of each gate electrode are formed in the substrate at each side of the sidewall in a direction perpendicular to the first direction, the distance between the source region and the corresponding drain region has improved consistency, i.e., a more uniformed gate profile and less kinks. Thus, channel length variations caused by the surface roughness on the sidewalls of the corresponding gate electrode may be prevented, and electrical properties and performance of the semiconductor structure may be improved.

Further, a double patterning method is used to form the gate electrode pattern layer. The gate electrode pattern layer includes a first pattern layer and a second pattern layer, perpendicular to each other, to reduce the fabrication difficulty when forming the first pattern layer and the second pattern layer. The formed first pattern layer and the second pattern layer may have improved quality, and the gate electrodes formed may have improve quality accordingly.

Further, the first pattern layer is used as the etch mask to etch the gate electrode pattern film and form the initial gate electrode pattern layer. The initial gate electrode pattern layer includes an initial silicon layer. The sidewalls of the initial silicon layer in a direction perpendicular to the first direction may have a first Poly LWR. Accordingly, the subsequently-formed silicon layer formed by patterning the initial silicon layer may also have sidewalls with the first Poly LWR. In one embodiment, after the initial silicon layer is formed, the sidewalls of the initial silicon layer in a direction perpendicular to the first direction may be repaired or treated using an etch-repairing treatment such that the sidewalls of the initial silicon layer may have a second Poly LWR lower than the first Poly LWR. Accordingly, the subsequently-formed silicon layer may also have sidewalls with second Poly LWR in a direction perpendicular to the first direction. The sidewalls of the gate electrode pattern layer may thus have a reduced Poly LWR. The method provided by the present disclosure avoids an etch-repairing treatment on the sidewalls of the silicon layer in a direction perpendicular to the first direction to prevent the width of the silicon layer, in direction parallel to the first direction, to decrease. Thus, an increased head-to-head distance between adjacent gate electrodes may be prevented. Accordingly, leakage current in the gate electrodes may be prevented.

Furthermore, in the present disclosure, the thickness of the silicon layer is equal to the thickness of the removed portion of the gate electrode film by the main etch process. Thus, when the silicon layer is fully removed to expose the hard mask layer, the end-point of the main etch process is reached. In addition, an OES method is used to detect the end-point of the main etch process. Because the gas composition generated by the main etch process etching the silicon layer is different from the gas composition generated by the main etch process etching the hard mask layer, when the OES detects a variation in the gas composition, the main etch process may be stopped. Thus, the present disclosure may accurately detect the end-point of the main etch process. Quality of the formed gate electrodes may be further improved and more robust devices can be formed.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for fabricating semiconductor devices, comprising:
   providing a substrate with a gate electrode film on the substrate and a gate electrode pattern film on the gate electrode film, the gate electrode pattern film including a hard mask material layer and a silicon material layer on the hard mask material layer;
   forming at least one pattern layer on the gate electrode pattern film;
   using the at least one pattern layer as the etch mask to etch portions of the gate electrode pattern film to expose portions of the gate electrode film and form a gate electrode pattern layer on the gate electrode film, the gate electrode pattern layer including a hard mask layer and a silicon layer on the hard mask layer, and sidewalls of the silicon layer in a direction perpendicular to a first direction having a first poly line width roughness (Poly LWR); and
   performing an etch-repairing treatment on the sidewalls of the silicon layer in the direction perpendicular to the first direction such that the sidewalls of the silicon layer in the direction perpendicular to the first direction have a second Poly LWR, the second Poly LWR being lower than the first Poly LWR.

2. The method according to claim 1, further including:
   using the gate electrode pattern layer as an etch mask to etch the gate electrode film to expose portions of the substrate and form gate electrodes on the substrate; and
   forming a source region and a drain region in the substrate each on one side of a sidewall of each gate electrode, the sidewall being in a direction perpendicular to the first direction.

3. The method according to claim 1, wherein:
   the silicon material layer is made of single-crystal silicon, poly-silicon, amorphous silicon, or a combination thereof;
   the gate electrode film is made of poly-silicon, doped poly-silicon, or a combination thereof; and
   the at least one pattern layer is made of photoresist.

4. The method according to claim 1, wherein a thickness of the silicon material layer is greater than a thickness of the hard mask material layer.

5. The method according to claim 1, wherein the hard mask material layer is made of silicon dioxide, silicon nitride, silicon oxynitride, silicon carbide, silicon oxycarbide, SiOCN, amorphous carbon, or a combination thereof.

6. The method according to claim 1, wherein a process for forming the gate electrode layer further includes:
   forming a first pattern layer on the gate electrode pattern film with patterns arranged parallel to the first direction to expose portions of the gate electrode pattern film between adjacent patterns of the first pattern layer;
   using the first pattern layer as an etch mask to etch exposed portions of the gate electrode pattern film to expose portions of the gate electrode film and form an initial gate electrode pattern layer with patterns arranged in a direction parallel to the first direction on the gate electrode film, the initial gate electrode pattern layer including an initial hard mask layer and an initial silicon layer formed on the initial hard mask layer;
   forming a second pattern layer on the initial gate electrode pattern layer arranged in a direction parallel to the second direction to expose portions of the initial gate electrode layer between adjacent patterns of the second pattern layer, the second direction being perpendicular to the first direction; and
   using the second pattern layer as an etch mask to etch exposed portions of the initial gate electrode pattern layer to expose portions of the gate electrode film and form the gate electrode pattern layer on the gate electrode film.

7. The method according to claim 6, wherein
   sidewalls of the initial silicon layer in a direction perpendicular to the first direction have the first Poly LWR; and
   performing the etch-repairing treatment on the sidewalls of the silicon layer includes performing the etch-repairing treatment on the sidewalls of the initial silicon layer in a direction perpendicular to the first direction after the initial gate electrode pattern layer is formed such that the sidewalls of the initial silicon layer in a direction perpendicular to the first direction have the second Poly LWR.

8. The method according to claim 7, wherein:
the etch-repairing treatment includes a chemical downstream etch; and
the first pattern layer is removed after the sidewalls of the initial silicon layer is repaired with the etch-repairing treatment.

9. The method according to claim 8, wherein parameters of the chemical downstream etch process include etchant gases of a $CF_4$ gas and an $O_2$ gas, a flow rate of the $CF_4$ being about 100 sccm to about 1000 sccm and a flow rate of the $O_2$ of being about 5 sccm to about 100 sccm; an etch source power of about 100 W to about 2000 W; an reaction chamber temperature of about 0 degrees Celsius to about 200 degrees Celsius; and an etching time of about 10 seconds to about 60 seconds.

10. The method according to claim 6, a process before forming the second pattern layer further includes forming a bottom antireflective layer and forming an organic polymer layer to cover the gate electrode film and sidewalls of the initial gate electrode pattern layer.

11. The method according to claim 6, wherein an orthogonal projection of the first pattern layer on the substrate is perpendicular to an orthogonal projection of the second pattern layer on the substrate.

12. The method according to claim 11, wherein the substrate includes:
a plurality of gate electrode regions and doped regions between adjacent gate electrode regions;
a plurality of active areas and a plurality of isolation regions in each gate electrode region, an isolation region formed between two adjacent active areas; and
projection of the first pattern layer on the substrate covers the gate electrode regions, and projection of the second pattern layer on the substrate covers active areas and the isolation regions between adjacent active areas.

13. The method according to claim 12, wherein a gate electrodes covers active areas and portions of isolation regions adjacent to the active areas.

14. The method according to claim 6, wherein
a material of the first pattern layer includes photoresist;
a material of the second pattern layer includes photoresist; and
a wet stripping process, an ashing process, or a combination of a wet stripping process and an ashing process is used to remove the second pattern layer.

15. The method according to claim 1, wherein a process to etch the gate electrode film to expose portions of the substrate includes:

using the gate electrode pattern layer as an etch mask, performing a main etch process on the gate electrode film to remove a portion of the gate electrode film with a thickness being a portion of a total thickness of the gate electrode film and remove at least a portion of the silicon layer such that the main etch process is stopped when an end-point of the main etch process is reached; and
using the gate electrode pattern layer as an etch mask to remove remaining portions of the gate electrode film and form the gate electrodes on the substrate.

16. The method according to claim 15, wherein:
optical emission spectroscopy (OES) is used to the end-point of the main etch process; and
a thickness of the silicon layer is dependent on the thickness of the gate electrode film.

17. The method according to claim 15, wherein
the main etch process is stopped when the silicon layer is removed to expose the hard mask layer such that the end-point of the main etch process is reached;
a thickness of the silicon layer is equal to a thickness of the portion of the gate electrode film removed by the main etch process;
a thickness of the silicon material layer is smaller than a thickness of the gate electrode film; and
an optical emission spectroscopy method is used to detect the end-point of the main etch process.

18. The method according to claim 17, wherein etchant gases of the main etch process include $SF_6$, $CF_4$, $CH_2F_2$, or a combination thereof; and the main etch process is an asynchronous pulse dry etch process.

19. The method according to claim 17, parameters of the asynchronous pulse dry etch process include etchant gases of a HBr gas, a $SiCl_4$ gas, an $O_2$ gas, or a combination thereof; a flow rate of the HBr gas of about 10 sccm to about 5000 sccm; a flow rate of the $SiCl_4$ gas of about 5 sccm to about 100 sccm; and a flow rate of the $O_2$ gas of about 5 sccm to about 100 sccm; a power of the power source of about 500 W to about 2500 W; a duty cycle of the power provided by the source of about 10% to about 80%; a bias power of about 0 W to about 500 W; a duty cycle of the bias power of about 10% to about 80%; a pressure in the reaction chamber of about 10 mTorr to about 200 mTorr; and an etching time of about 10 seconds to about 600 seconds.

20. The method according to claim 1, wherein the substrate includes fins formed on a surface of the substrate, an isolation layer covering the substrate and portions of the sidewalls of the fins, a top surface of the isolation layer being lower than a top surface of a fin.

* * * * *